MANUFACTURE OF THERMO-ELECTRIC GENERATORS

Filed Nov. 25, 1966

Inventor
W. THORP
By
Cameron, Kerkam & Sutton
Attorneys 3,434,203

MANUFACTURE OF THERMO-ELECTRIC GENERATORS

William Thorp, Timperley, England, assignor to Ferranti, Limited, Hollinwood, Lancashire, England, a company of Great Britain and Northern Ireland Filed Nov. 25, 1966, Ser. No. 596,889
Claims priority, application Great Britain, Nov. 27, 1965, 50,489/65
Int. Cl. H01l *15/00*
U.S. Cl. 29—573 14 Claims

ABSTRACT OF THE DISCLOSURE

A thermoelectric generator comprising a plurality of stacked pairs of layers of two different thermoelectric materials has each layer separated from the next, except for a narrow strip along one edge, by a layer of electrically insulating material. The thermoelectric generator is produced by a continuous reduction deposition process which ensures a satisfactory mechanical and electrical bond between adjacent layers of thermoelectric material.

This invention relates to the manufacture of thermoelectric generators of the type having a plurality of pairs of layers of two different thermoelectric materials, the layers of each pair being in contact with one another along a narrow strip at one edge and otherwise separated by a layer of electrically insulating material, and each pair of layers being in contact with the adjacent pair of layers along a narrow strip at the opposite edge and otherwise separated by a layer of electrically insulating material. Such a thermoelectric generator is hereafter referred to as being "of the type stated."

One method which has been used for the manufacture of thermoelectric generators of the type stated involves casting layers of p-type silicon-germanium alloy and n-type silicon-germanium alloy in the form of ingots, and arranging the ingots of the two materials alternately in a stack. Each ingot is separated from the next by a layer of electrically insulating material which covers all of the preceding ingot except for a narrow strip along one edge. This allows adjacent ingots to be connected together by an alloying process. Thermoelectric generators produced by this method are relatively expensive because the processes involved are necessarily slow and complex. For example, the ingots of alloy are usually formed by an isothermal solidification process under very carefully controlled conditions. The subsequent building-up of the stack of ingots and the carrying-out of the alloying process to join the ingots are separate processes.

It is an object of the invention to provide a method of manufacture of a thermoelectric generator of the type stated in which the formation of the layers of thermoelectric material, the building-up of the stack of layers, and the interconnection of the layers are performed by a single continuous process.

According to the present invention a method of manufacture of a thermoelectric generator of the type stated comprises the steps of heating a substrate in a chamber, passing through said chamber a mixture of gases which react together at the exposed heated surface of the substrate or of the preceding layer, as the case may be, to produce on said surface a layer of a required one of said materials, varying the composition of the mixture of gases as required to produce each layer in turn, and preventing the formation of said electrically insulating material along narrow strips, alternately on opposite sides of the layers of thermoelectric material.

Figure 1:
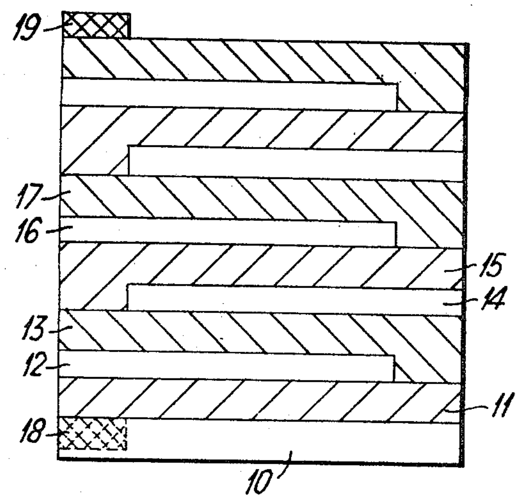
Figure 2:
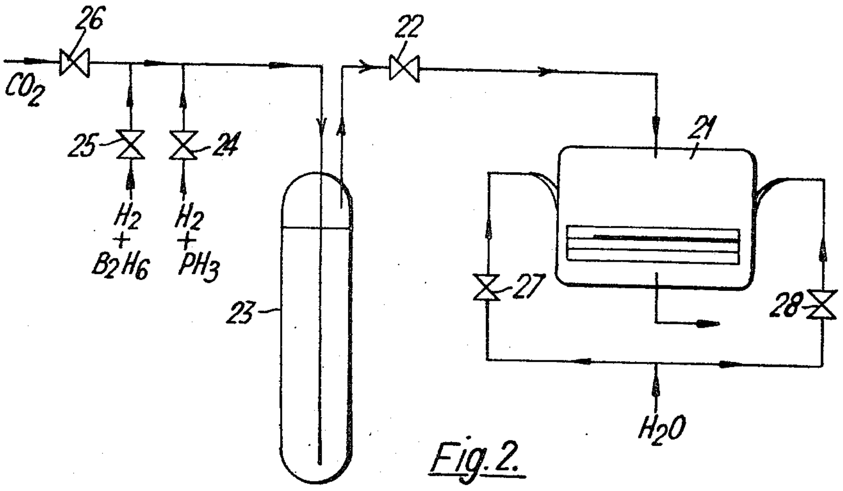

The invention will now be described with reference to the accompanying drawings, in which:

FIGURE 1 is an end elevation view of a thermoelectric generator made according to the invention; and FIGURE 2 is a flow-line diagram of part of the apparatus used in the manufacture of the thermoelectric generator of FIGURE 1.

The dimensions and relative proportions of FIGURE 1 have been exaggerated to clarify the constructional details of the generator.

Referring now to FIGURE 1, the thermoelectric generator is formed on a substrate 10 of conductive material such as tantalum. On this substrate is formed a layer of p-type or n-type silicon-germanium alloy 11 covering substantially the whole of one surface of the substrate 10. A layer 12 of electrically insulating material such as silicon dioxide, in the form of quartz glass, is formed over all but a narrow strip along one edge of the alloy layer 11 by masking-off the edge of the alloy layer on which the quartz glass is not required. Over both the insulating layer 12 and the exposed portion of the alloy layer 11 is formed a layer of silicon-germanium alloy 13 of opposite conductivity kind to that of the layer 11. A further layer of quartz glass 14 is formed on the alloy layer 13, covering all but a narrow strip along the edge of layer 13 opposite to that which is in contact with the first alloy layer 11.

The remainder of the stack of layers is built up in the same way, to form an alloy layer 15 of the same conductivity kind as layer 11, an insulating layer 16, and alloy layer 17 of the same conductivity kind as the layer 13, and so on. Each successive insulating layer exposes a narrow strip along one edge of an alloy layer opposite to the edge exposed by the previous insulating layer. Adjacent alloy layers are thus connected together along one edge by the molecular bonding produced as the layers are formed.

When a complete stack has been formed, consisting of equal numbers of layers of each type of alloy, the substrate 10 is removed by etching and two conductive strips 18 and 19 are formed on the top and bottom faces of the stack. These strips provide suitable connection points for flexible conductors.

FIGURE 2 shows a flow-line diagram of one form of apparatus suitable for applying the invention.

A deposition cell 21, in which the thermoelectric generator is produced, is connected through a valve 22 to the output of an evaporator 23. The input to the evaporator 23 is connected to three gas sources through three valves 24, 25 and 26. Water sprays 27 and 28 are provided one on each side of the deposition cell 21.

Valve 24 is connected to a source providing a mixture of pure hydrogen and phosphine ($PH_3$) the latter being an n-type impurity, and valve 25 is connected to a source providing a mixture of pure hydrogen and diborane ($B_2H_6$), a p-type impurity. The third valve 26 is connected to a source of carbon dioxide. The rate of flow of each gas or gas mixture will usually be measured by a flowmeter (not shown.) The evaporator 23 contains a mixture of silicon tetrachloride and germanium tetrachloride. These are both liquids and their partial vapour pressures are such that the alloy produced contains approximately 70% silicon and 30% germanium. The water sprays 27 and 28 are used to cool either one or the other of the sides of the deposition chamber when required.

The steps in the process will now be described.

The conductive substrate 10 is heated to a temperature between 900° C. and 1350° C. by passing an electric current through it. The actual temperature depends upon the alloy composition and rate of deposition required. Valves 22 and 24 are opened and a stream of hydrogen containing phosphine is passed through the evaporator 23. The gas becomes saturated with a mixture of silicon tetrachloride vapour and germanium tetrachloride vapour, and this is carried over into the deposition cell.

The silicon tetrachloride and germanium tetrachloride vapours are reduced by the hydrogen at the surface of the substrate and deposit an n-type silicon-germanium alloy layer on the substrate. The resulting hydrogen chloride and other gaseous reaction products are swept out of the deposition cell by the stream of gas. This step of the process is continued until the layer of alloy reaches the desired thickness. Valve 24 is then closed.

The next step is to cover the n-type alloy layer with an electrically insulating layer of silicon dioxide glass, except for a narrow strip along one edge of the alloy layer. The masking effect is produced by cooling one side of the deposition cell 21 with water sprays 27. This has the effect of cooling the immediately-adjacent edge of the substrate and the alloy layer to a temperature below that at which deposition will take place. Valves 25 and 26 are opened and a mixture of hydrogen, diborane and carbon dioxide passes through the evaporator, where it becomes saturated with silicon and germanium tetrachloride vapour. In the deposition cell the hydrogen and the mixed silicon and germanium tetrachloride vapours react at the surface of the alloy layer to form hydrogen chloride and a silicon-germanium alloy, the latter being immediately oxidised by the carbon dioxide to form an insulating oxide layer. The carbon monoxide which is also produced is swept out of the cell by the stream of gases. Owing to the presence of the diborane, the insulating layer is in the form of a borate glass, consisting largely of silicon dioxide, but with some germanium oxide present as well. As stated above this layer covers the entire alloy layer except for a narrow strip along one edge. When a layer of the required thickness has been formed valve 26 is closed.

The layer of the second thermoelectric material, which is p-type silicon-germanium alloy, is produced by shutting off the cooling water spray 27, and passing the hydrogen-diborane mixture from valve 25 through the evaporator 23. The chemical reaction which takes place is the same as that which formed the n-type layer.

To build up a stack of layers as required the above three steps are repeated, simply by manipulation of the valves 24, 25 and 26 and the water sprays 27 and 28. Between each pair of alloy layers an insulating layer is formed, the water sprays 27 and 28 being used to reduce the width of the insulating layer below that of the alloy layer to allow for the interconnection of the adjacent alloy layers. As stated above, alternate interconnections between alloy layers are formed on opposite sides of the stack.

The stack is built up to the required size, with equal numbers of layers of the two conductivity types.

The process described above results in a thermoelectric generator in which the formation of the layers of thermoelectric material, the building-up of a stack of such layers and the electrical interconnection of the layers are performed simultaneously by a single process. The only remaining steps are the removal of the substrate 10 and the formation of the two conductive strips 18 and 19. These may be applied by any suitable plating, evaporation or vapours deposition techniques.

The apparatus described with reference to FIGURE 2 may be varied insofar as the provision of the mixture of gases and vapours is concerned. As described above the p-type and n-type impurities are mixed with the hydrogen gas. However these impurities may be injected into the gas or vapour stream, or may be mixed with the silicon and/or germanium tetrachlorides. Other impurities may be used in place of those described above. Similarly the silicon and germanium tetrachlorides may be contained in separate evaporators. The form of the evaporator may be changed so that the gas stream is passed over rather than through, the liquid tetrachlorides, or the liquid may be fed into the gas stream by dip feed methods.

The efficiency of the process may be increased by re-circulating the gases leaving the deposition chamber after removing the waste products.

It is not essential to include diborane in the gas mixture used to form the insulating layer, but it has been found that a borate glass layer has a coefficient of expansion nearer to that of the alloy than has a quartz glass layer. The carbon dioxide, or carbon dioxide-diborane mixture may be passed over or through silicon tetrachloride alone. An oxidising gas other than carbon dioxide, such as water vapour, may be used in the formation of the insulating layer.

The preferred silicon-germanium alloy is that containing 70% silicon and 30% germanium though alloys containing from 65% to 85% silicon may be used.

In place of the water sprays used to control the deposition of the insulating layer a means of heating one side of the substrate only may be used. This would involve the use of two heaters. Alternatively a mechanical method of masking may be used.

The above description has referred throughout to the use of silicon-germanium alloys as the thermoelectric materials. This should not be taken as excluding other thermoelectric materials which may be formed by the reduction of a vapour in the manner described. Similarly the insulating layer need not be a silicon glass layer, so long as it may be formed in the same manner. The sources of silicon and germanium need not be their tetrachloride, though these are the preferred materials. For example the hydrides of silicon and germanium may be used.

The substrate on which the thermoelectric generator is built up need not be tantalum as described, but should preferably be capable of being heated to the required temperature by the passage of an electric current. Carbon is a suitable alternative material.

Thermoelectric generators of any size may be made by this method. The output current of a generator is partly determined by its cross-sectional area, whilst the output voltage varies with the number of pairs of layers. Hence a generator having a required output current under certain conditions is easily produced by adjusting the dimensions of the device produced. Usually a relatively long bar will be formed and subsequently cut into separate elements each of the required length.

What is claimed is

1. A method of manufacture of a thermoelectric generator of the type having a plurality of stacked pairs of layers of two different thermoelectric materials, the layers of each pair being in contact with each other along a narrow strip on one edge of the stack and otherwise separated by a layer of electrically insulating material, and each pair of layers being in contact with the adjacent pair of layers along a narrow strip on the opposite edge of the stack and otherwise separated by a layer of electrically insulating material, comprising the steps of heating a substrate in a chamber, passing through said chamber a mixture of gases which react together at the exposed heated surface of the substrate to produce on said surface a layer of a first thermoelectric material, varying the composition of gases to produce in turn a layer of electrically insulating material on the exposed surface of said first layer and a layer of a second thermoelectric material on the exposed surface of said layer of electrically insulating material, and preventing the formation of said electrically insulating material along narrow strips alternately on opposite edges of the layers of said first and second thermoelectric materials.

2. A method of manufacture as claimed in claim 1 in which said first thermoelectric material is a silicon-germanium alloy of p-type conductivity, the mixture of gases forming the layer of said material including hydrogen, silicon tetrachloride vapour, germanium tetrachloride vapour, and a p-type impurity material.

3. A method of manufacture as claimed in claim 2 in which the p-type impurity material is diborane.

4. A method of manufacture as claimed in claim 2 in which said silicon-germanium alloy consists of approximately 70% silicon and 30% germanium by weight.

5. A method of manufacture as claimed in claim 1 in which said second thermoelectric material is a silicon-germanium alloy of n-type conductivity, the mixture of gases forming the layer of said material including hydrogen, silicon tetrachloride vapour, germanium tetrachloride vapour, and an n-type impurity material.

6. A method of manufacture as claimed in claim 5 in which the n-type impurity material is phosphine.

7. A method of manufacture as claimed in claim 5 in which said silicon-germanium alloy consists of approximately 70% silicon and 30% germanium by weight.

8. A method of manufacture as claimed in claim 1 in which said electrically insulating material is a silicon-germanium alloy oxide, the mixture of gases forming the layer of said material including hydrogen, silicon tetrachloride vapour, germanium tetrachloride vapour and an oxidising material.

9. A method of manufacture as claimed in claim 8 in which the oxidising material is carbon dioxide.

10. A method of manufacture as claimed in claim 8 in which the oxidising material is water vapour.

11. A method of manufacture as claimed in claim 1 in which the formation of said electrically insulating material along said narrow strips is prevented by cooling that side of the chamber adjacent to the appropriate edge of the then exposed layer of thermoelectric material.

12. A method of manufacture as claimed in claim 1 in which the formation of said electrically insulating layer along said narrow strips is prevented by physically masking the appropriate area of the then exposed layer of thermoelectric material.

13. A method of manufacture as claimed in claim 1 which includes the additional steps of removing said substrate and forming electrical connections on each of the two exposed layers of thermoelectric material along the edge thereof opposite to that connected to the adjacent layer of thermoelectric material.

14. A method of manufacture of a thermoelectric generator of the type having a plurality of stacked pairs of layers of two different thermoelectric materials, the layers of each pair being in contact with each other along a narrow strip on one edge of the stack and otherwise separated by a layer of electrically insulating material, and each pair of layers of thermoelectric materials being in contact with the adjacent pair of layers of thermoelectric materials along a narrow strip on the opposite edge of the stack and otherwise separated by a layer of electrically insulating material, comprising the steps of heating a substrate in a chamber, passing through said chamber a mixture of gases which react together at the exposed heated surface of the substrate to produce on said surface a layer of a first thermoelectric material, passing through said chamber a second mixture of gases which react to produce on the surface of said first layer of thermoelectric material a layer of electrically insulating material while preventing the formation of said electrically insulating material along a narrow strip on one edge of said first layer of thermoelectric material, passing through said chamber a third mixture of gases which react together to produce on the surfaces of said electrically insulating layer and said strip on the first layer of thermoelectric material a layer of a second thermoelectric material, again passing through said chamber said second mixture of gases to produce on the surface of said second layer of thermoelectric material a layer of electrically insulating material while preventing the formation of said electrically insulating material along a narrow strip on the edge of said second layer of thermoelectric material opposite to the non-insulated edge of said first layer of thermoelectric material, and repeatedly passing said first, second and third mixtures of gases through said chamber to produce in turn additional pairs of layers of said first and second thermoelectric materials separated by layers of said electrically insulating material except along the narrow strips on opposite edges of said layers of first and second thermoelectric materials.

References Cited

UNITED STATES PATENTS

| | | | |
|---|---|---|---|
| 3,047,438 | 7/1962 | Marinace | 148—175 X |
| 3,071,495 | 1/1963 | Hanlein | 117—212 |
| 2,811,568 | 10/1957 | Lloyd | 136—225 X |
| 3,237,062 | 2/1966 | Murphy. | |
| 3,243,323 | 3/1966 | Corrigan et al. | 148—175 |
| 3,370,262 | 2/1968 | Marty et al. | 117—215 X |

WILLIAM I. BROOKS, *Primary Examiner.*

U.S. Cl. X.R.

117—215; 136—224; 148—175